TRANSISTOR CIRCUIT HAVING STABILIZED OUTPUT D.C. LEVEL

Filed May 28, 1968 3 Sheets-Sheet 1

INVENTORS
MINORU NAGATA
NOBUHIKO AOKI
SHIKAYUKI OCHI

BY Craig & Antonelli
ATTORNEYS

May 12, 1970 MINORU NAGATA ET AL 3,512,096

TRANSISTOR CIRCUIT HAVING STABILIZED OUTPUT D.C. LEVEL

Filed May 28, 1968 3 Sheets-Sheet 2

INVENTORS
MINORU NAGATA
NOBUHIKO AOKI
SHIKAYUKI OCHI

BY Craig & Antonelli
ATTORNEYS

TRANSISTOR CIRCUIT HAVING STABILIZED OUTPUT D.C. LEVEL

Filed May 28, 1968 3 Sheets-Sheet 3

INVENTORS
MINORU NAGATA
NOBUHIKO AOKI
SHIKAYUKI OCHI

BY Craig & Antonelli
ATTORNEYS

United States Patent Office 3,512,096

Patented May 12, 1970

3,512,096

TRANSISTOR CIRCUIT HAVING STABILIZED OUTPUT D.C. LEVEL

Minoru Nagata, Kodaira-shi, Nobuhiko Aoki, Katsuta-shi, and Shikayuki Ochi, Kokubunji-shi, Japan, assignors to Hitachi, Ltd., Tokyo, Japan, a corporation of Japan Filed May 28, 1968, Ser. No. 732,760
Claims priority, application Japan, May 31, 1967, 42/34,155
Int. Cl. H03g *3/30;* H03f *3/68, 3/42*
U.S. Cl. 330—29 10 Claims

ABSTRACT OF THE DISCLOSURE

A first and second amplifying transistors are connected in cascode configuration, a bypass transistor connected in parallel to the second transistor to form a signal bypass circuit, and a first and second load resistor connected respectively in the collector circuit of said second and bypass transistors, the base potential of the bypass transistor being controllable to vary the bypass circuit impedance so that an input signal applied to the base of the first transistor may be amplified and transmitted out a gain controlled output signal from the collector of the second transistor.

A load transistor is connected in series in the first load resistor circuit to make variable the output D.C. level in accordance with the emitter potential thereof, and the base potential of which is controlled by the collector potential of the bypass transistor, whereby stabilizing the output D.C. level during gain control operation.

BACKGROUND OF THE INVENTION

Field of the invention

This invention relates to a transistor circuit, and more particularly to an improved transistor circuit which provides the stabilized D.C. output level even if the D.C. bias current varies in accordance with, for example, a gain controlling action to allow direct coupling to another circuit, thus particularly useful in an integrated circuit.

Description of the prior art

Generally, a direct-coupled type of transistor circuit can be composed only of transistors, resistors and diodes without using any capacitor element. This property satisfies one of the most important conditions desired in a semiconductor integrated circuit. In this respect, the direct-coupled type of transistor circuit has in the case of being used in an integrating circuit an advantage not present in other circuit systems. However, the drawback of the direct-coupled type of transistor circuit is its D.C. variation which is amplified and transmitted together with an A.C. signal. Where several amplifiers are directly connected in cascade connection, a variation of the D.C. bias current due to a certain cause appearing in the preceding amplifier stage causes a large variation in the input impedance or the D.C. operating potential of the following stages. There are various difficulties in circuit design to overcome the above-mentioned drawback and thus such integration is hardly performed.

A solution to this problem is especially urgently desired in such devices as a television, a radio and other communication apparatus containing stages whose circuit action necessarily causes a D.C. variation such as an AGC circuit for maintaining the signal transmission characteristic always in a favorable state.

SUMMARY OF THE INVENTION

The major object of this invention is to provide a transistor circuit in which, even if the D.C. bias current varies, the input impedance or the output D.C. level is kept stable, to enable a direct-coupled type connection and thus extremely advantageous for circuit integration.

The basic concept of this invention lies in the fact that the output circuit of a transistor amplifier circuit having input and output terminals, which amplifies an input signal applied at the input terminal and derives an output from the output terminal, is connected with a series circuit of a load transistor and a load resistor. This load transistor having an emitter, a base, and a collector is used for compensating the output D.C. level variation. The load resistor is connected between the output terminal of the transistor amplifier circuit and the emitter of the load transistor.

According to this invention, the base bias potential of the load transistor is controlled to be varied in inverse proportion to the variation of the load current flowing through the transistor amplifier circuit. Therefore, the variation in the D.C. voltage at the output terminal is compensated by the variation in the D.C. potential at the emitter of the load transistor. Thus, the output D.C. level at the output terminal is stabilized.

The above concept of this invention can be applied to various kinds of transistor circuits. Next, a typical circuit embodying this invention will be explained in proper comparison with a prior art circuit with reference to the accompanying drawings. This invention is, of course, not limited to such circuits as shown in the following embodiments.

DESCRIPTION OF THE PREFERRED EMBODIMENTS

Figures 1, 2, 3:
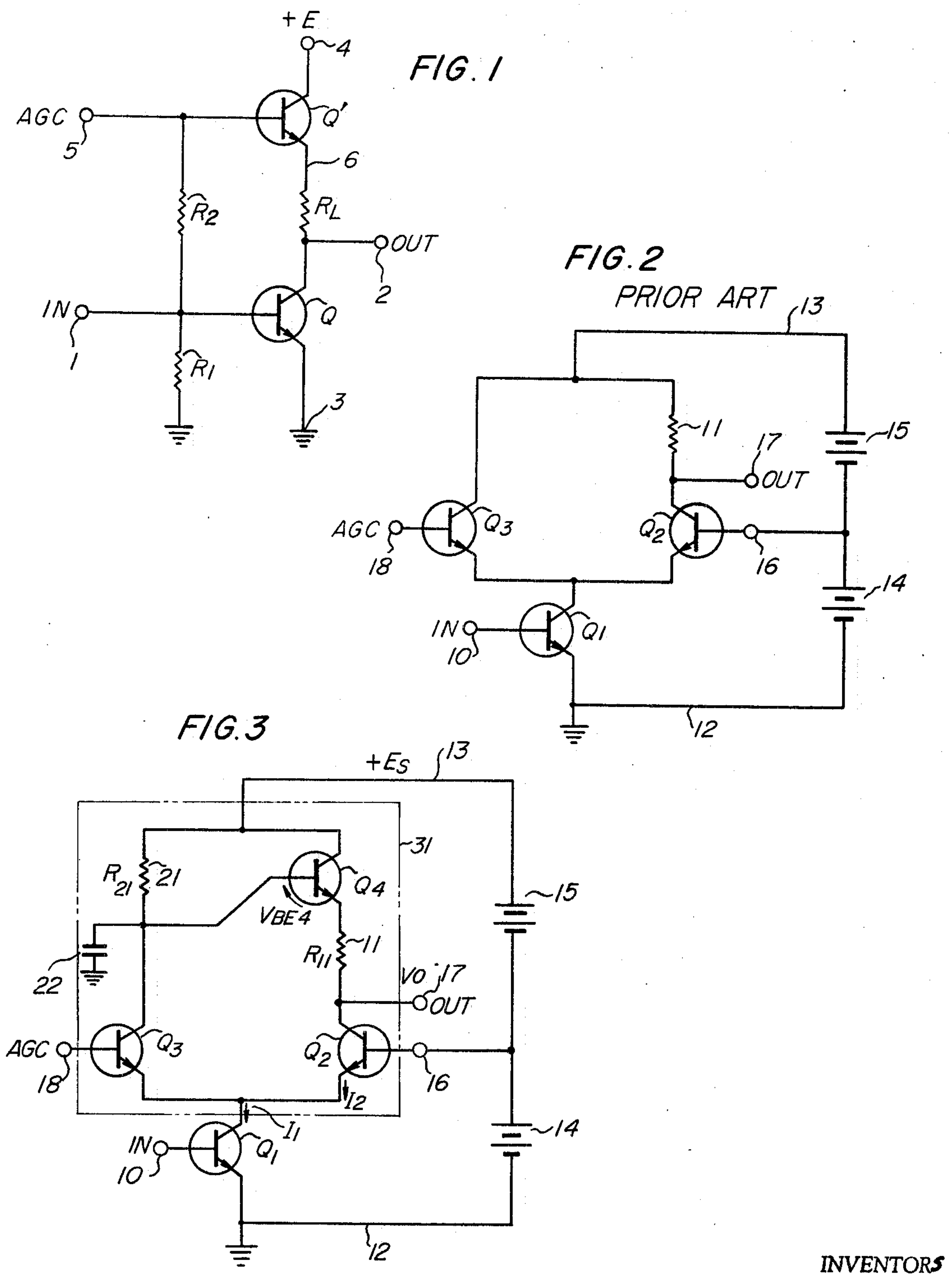
FIG. 1 shows a transistor circuit according to one embodiment of this invention to explain the principle of the present invention.
FIG. 2 shows a well-known prior art transistor circuit functioning as a differential type AGC circuit.
FIGS. 3 to 5 show the inventive transistor circuits obtained by improving the above prior art circuit. The circuit shown in FIG. 5 has a structure particularly suited to a semiconductor integrated circuit.

In FIG. 1, a transistor Q in common emitter configuration functions as a signal amplifier, which has a base connected to an input terminal 1, a collector connected to an output terminal 2, and an emitter connected to ground 3. A load resistor $R_L$ is connected at one end to the collector of the transistor Q and at the other end to the emitter of a load transistor Q'. The collector of the load transistor is connected to a source voltage supplying terminal 4 to give a bias current to the amplifying transistor Q. The base of the amplifying transistor Q has two resistors $R_1$ and $R_2$, the former grounds the base of the transistor Q, and the latter connects the base to a terminal 5 respectively. In this circuit the terminal 5 is preferably supplied with an AGC signal and connected to the base of the load transistor Q'. This connection enables the load transistor Q' to compensate the variation in the output D.C. level accompanying the AGC action, thus providing an improved AGC transistor circuit with a stabilized D.C. level.

The AGC signal can be generated by a well-known means, which for example, comprises a capacitor for selectively passing therethrough an A.C. component out of the output signal and a suitable circuit consisting of a detector and a filter for converting the A.C. component to a D.C. signal representive of the strength of the A.C. signal.

In a well-known transistor amplifying circuit the load resistor $R_L$ is connected directly to the source voltage supplying terminal 4 to give a fixed potential thereto, when the potential at the terminal 5 varies in accordance with the AGC signal, the base bias potential of the amplifying transistor Q varies and the current amplification factor thereof also varies. Therefore a gain controlled output signal appears at the output terminal 2. Since the impedance of the amplifying transistor Q varies in accordance with the base bias potential, the bias current flowing from a D.C. bias source connected to the source voltage supplying terminal 4 to the amplifier transistor varies, so that the D.C. voltage drop generated across the load resistor $R_L$ varies in accordance with the AGC action. The D.C. potential at the output terminal therefore varies in response to the variation in the D.C. voltage drop. This defect has disturbed the direct coupling between succeeding circuits.

According to this invention, it is characterized in that the load resistor $R_L$ is connected to the emitter of the load transistor Q′, and that the transistor Q′ is controlled by the AGC signal applied to its base.

Since the transistor Q′ has a predetermined voltage drop between the base and the emitter, the emitter potential varies in response to the base potential. Therefore, in the invented circuit of FIG. 1, the end 6 of the load resistor $R_L$ is considered to be connected to a variable potential which varies in accordance with the AGC signal. This D.C. variable potential is so controlled to respond to the AGC signal so as to compensate properly the variation in the D.C. voltage drop appearing across the load resistor. Namely, the emitter potential rises with an increase in D.C. voltage drop across the load resistor $R_L$ and vice versa. Thus, the variation in the output D.C. level is eliminated.

FIG. 2 shows a prior art transistor circuit having a well-known AGC function which is suitable for application of the present inventive concept with respect to stabilization of the output D.C. level.

In this figure, $Q_1$ is an amplifying transistor whose base acts as a signal input terminal 10, to which, though not shown, an input A.C. signal source is connected. The collector circuit of the amplifying transistor $Q_1$ has transistor $Q_2$ of common base configuration and a load resistor 11, which constitute a so-called cascode amplifier. An output terminal 17 is provided to the collector of the transistor $Q_2$. The emitter of transistor $Q_1$ is connected to the negative pole of a D.C. power source 14 through a negative voltage supplying line 12 while the collector of the transistor $Q_2$ is connected to the positive pole of a D.C. source 15 through a positive voltage supplying line 13 and the voltage sources 14 and 15 are connected in series to each other to thereby supply a D.C. bias current necessary for amplification. For the purpose of common base configuration the base of transistor $Q_2$ is connected to a fixed potential point 16 which is, in this figure, connected to the junction point of the D.C. power sources 14 and 15. The collector of the amplifying transistor $Q_1$ is also connected to bypass transistor $Q_3$ in parallel relation to the transistor $Q_2$. The transistor $Q_3$ is meant for controlling the gain of the output signal of the cascode amplifier. The emitter of transistor $Q_3$ is connected to the collector of the amplifying transistor $Q_1$ while the collector thereof is connected to the positive voltage supplying line 13 thereby to form a circuit which bypasses a part of the collector output signal of transistor $Q_1$.

In this transistor circuit, the signal current amplified by the transistor $Q_1$ is divided to flow through in the transistors $Q_2$ and $Q_3$ in accordance with their impedance ratio. The impedance of the transistor $Q_3$ varies in accordance with the AGC signal applied to the base terminal 18, so that the signal bypass component flowing through the transistor $Q_3$ is controlled by the AGC signal, whereby the current flowing through the transistor $Q_2$, i.e., the output signal current is controlled by the AGC signal. Even if the transistor circuit of the FIG. 2 is provided with a wide range gain control of the order of about 60 db by not varying the D.C. bias current of the amplifying transistor $Q_1$ but by varying the signal current flowing through the bypass circuit the input impedance of the amplifier circuit can be kept constantly. Although the transistor circuit is very advantageous in the respect as described above, it has, however, a defect that the output D.C. level at the output terminal may tend to vary with the gain control which may be caused by variation in the D.C. bias current flowing through the output circuit varying with the signal amplification. For example, when the gain is controlled within a range of between 40 and 60 db, the output D.C. level of the above conventional circuit varies at least 1 to 10 v.

Such a prior art circuit is improved as shown in FIG. 3 according to this invention. The characteristic of the circuit shown in FIG. 3 lies in the fact that the collector circuit of the output transistor $Q_2$ is connected with a load transistor $Q_4$ in series with a load resistor 11. The load transistor $Q_4$ is provided to stabilize the output D.C. level, the emitter of which is connected to the load resistor 11, the collector of which is connected to the positive voltage supplying line 13 and the base of which is connected to the collector of the bypass transistor $Q_3$. The bypass transistor $Q_3$ has a resistor 21 and a bypass capacitor 22 in the collector circuit thereof. Then, the base potential of the load transistor $Q_4$ varies with the variation in the D.C. voltage drop across the resistor 21.

The above circuit having the load transistor $Q_4$ for the compensation of the D.C. potential acts in the following manner. If the AGC signal varies in the direction of increasing the output signal gain, i.e. weakening the AGC action, a part of the signal current flowing through the output transistor $Q_2$ increases while the rest part of the current flowing through the bypass transistor $Q_3$ decreases. The D.C. bias current varies similarly with the variation in the signal current, thus increases the D.C. voltage drop across the load resistor in the output circuit. According to the invented circuit the output D.C. level of the output circuit is governed by the emitter potential of the load transistor $Q_4$ whose base is connected to the collector of the bypass transistor $Q_3$. Therefore, the output D.C. level is governed by the D.C. voltage drop across the resistor 21 in the circuit of the bypass transistor $Q_3$. Since the D.C. bias currents flowing through the output transistor $Q_2$ and the bypass transistor $Q_3$ are opposite in direction but substantially equal in absolute value, the resistance value ($R_{21}$) of the resistor 21 is preferably selected to be substantially equal to the value ($R_{11}$) of the load resistor 11, so that the emitter potential of the load transistor $Q_4$ is always controlled to be varied in opposite direction in response to the variation of the D.C. voltage drop across the load resistor 21 due to the D.C. current variation. So, the D.C. potential at the output terminal 17 is always kept constant.

The following explanation will prove the abovementioned operation. Denoting the amplified output current of the transistor $Q_1$ by $I_1$, the emitter current of the transistor $Q_2$ by $I_2$ which is nearly equal to the collector current thereof, the potential of the positive voltage supplying line 13 by $E_S$, and the voltage between the base and emitter of the transistor $Q_4$ by $V_{BE4}$, we have the voltage $V_0$ at the output terminal 17 as follows.

$$V_0 = E_S - R_{21}(I_1 - I_2) - V_{BE4} - R_{11}I_2 \quad (1)$$

If $R_{11} = R_{21}$, then $$V_0 = E_S - V_{BE4} - R_{21}I_1 \quad (2)$$

Thus, the output voltage $V_0$ becomes independent of the D.C. current flowing through the output transistor $Q_2$.

In the above circuit the capacitor 22 is provided to prevent the A.C. signal component flowing through the collector circuit of the bypass transistor $Q_3$ from being transmitted to the output circuit through the load transistor $Q_4$ and from cancelling the A.C. signal component in the output circuit of the amplifying transistor. Since the capacitor 22 is grounded at one end thereof and acts as an A.C. bypass, it is different from a conventional coupling capacitor element. In other words, the grounding capacitor is allowed to have a large grounding capacitance and a relatively large dielectric loss. Therefore, the above circuit can be composed into a semiconductor integrated circuit relatively easily.

Figures 4, 5, 6:
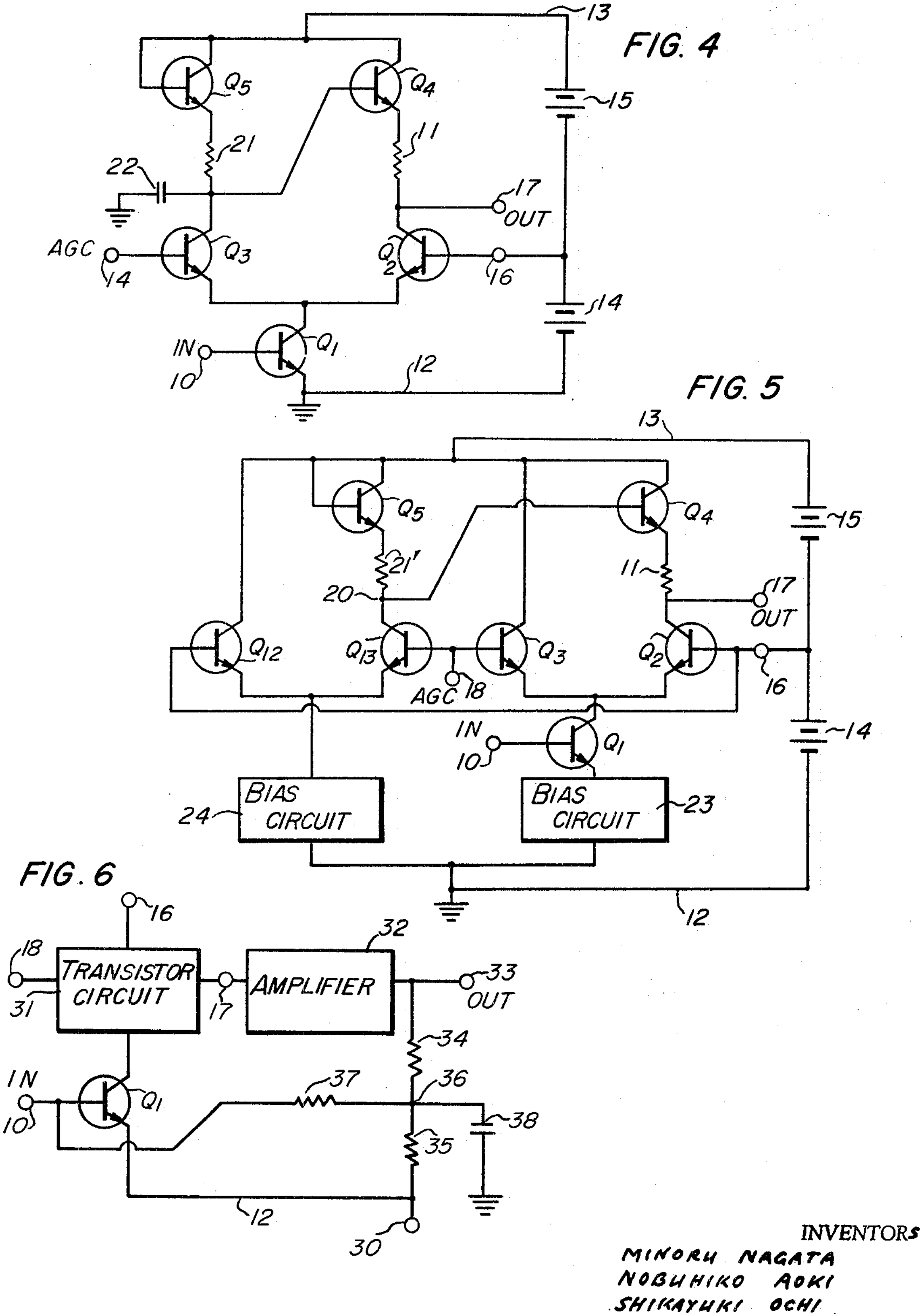
FIG. 6 shows an improved transistor circuit according to this invention which includes a D.C. feedback circuit.

FIG. 4 shows another modified example of the inventive circuit improving the circuit shown in FIG. 3. This circuit is characterized in that another transistor $Q_5$ short-circuiting its base and collector is added into the circuit of FIG. 3 in the manner that it is inserted in series with the resistor 21 in the collector circuit of the bypass transistor $Q_3$. In the circuit of FIG. 3 the voltage $V_{BE4}$ between the base and the emitter of the load transistor $Q_2$, in fact, slightly varies in accordance with the collector current of the transistor $Q_2$, followed by a certain variation in the output D.C. potential. The circuit of FIG. 4 provides a countermeasure against such a defect. Namely the variation in the voltage $V_{BE}$ of the transistor $Q_4$ due to the variation in the collector current of the output circuit is compensated by the variation in the base-to-emitter voltage $V_{BE5}$ of the transistor $Q_5$ due to the current variation in the bypass circuit. It is evident from the circuit composition that the variations in $V_{BE}$ of transistors $Q_4$ and $Q_5$ appear in the opposite direction from each other. Thus, even if the gain control is made in the range of more than 40 db, the variation in the output D.C. potential can be limited within 0.1 v. The number of such the transistor as $Q_5$ may be selected suitably in accordance with the circuit composition. Practically, the transistor $Q_5$ may be omitted depending on usage.

Although the circuits shown in FIGS. 3 and 4 employ a capacitor element 22 to ground the A.C. signal appearing in the collector circuit of the bypass transistor $Q_2$ and prevent a signal component from being transmitted to the output transistor circuit, they may be formed as will be described hereinafter into direct-coupled transistor circuits using only transistors and emitter elements of the same conductivity type without using any capacitor element for the A.C. bypass.

FIG. 5 shows one example of such a circuit. A first circuit portion consisting of transistors $Q_1$, $Q_2$ and $Q_3$ and a resistor element 11 corresponds to the circuit shown in FIG. 3. A second circuit portion formed with transistors $Q_{12}$ and $Q_{13}$ is added to the first circuit portion by connecting their bases to the bases of transistors $Q_2$ and $Q_3$ respectively. The transistor $Q_{13}$ operates equivalently in the D.C. sense as the bypass transistor $Q_3$ since their bases are connected in common to each other and supplied from the terminal 18 with an AGC signal. The transistor $Q_{12}$ makes a D.C. operation equivalent to the output transistor $Q_2$ since their bases are supplied with a suitable fixed bias voltage from a base bias terminal 16. The first and second circuits are driven by the bias circuits 23 and 24 connected to the emitter circuits thereof respectively so that an equal D.C. variation will appear in both circuits in response to the variation in the AGC signal.

The circuit of this invention is characterized by the facts that the output signal is derived from the collector terminal 17 of the output transistor $Q_2$ belonging to the first circuit and that the D.C. potential variation in the output signal due to the gain controlling action is compensated by the D.C. current variation flowing through the transistor $Q_{13}$. As shown in this figure, the collector circuit of the output transistor $Q_2$ is connected with a load transistor $Q_4$ to compensate the D.C. potential. The base terminal of the transistor $Q_4$ is connected to the collector circuit of the transistor $Q_{13}$. A resistor element 21' and a transistor $Q_5$ are inserted in series between the collector of the transistor $Q_{13}$ and the positive voltage supplying line 13 The D.C. potential variation appearing at the junction point between the resistor 21' and the transistor $Q_{13}$ is introduced to the output circuit of the transistor $Q_2$ by way of the load transistor $Q_4$. This circuit composition makes the A.C. signal supplied to a terminal 10 pass only in the first circuit but not in the second circuit. So, the variation associated with the variation of the AGC signal appearing in the collector circuit of the transistor $Q_{12}$ is only a D.C. variation, thus only the D.C. variation is transmitted to the output circuit through the transistor $Q_4$. It is apparent, therefore, that this D.C. variation acts to make the variation of the D.C. potential drop appearing in the output circuit vanish. Therefore, the present circuit is considered to be an ideal transistor circuit for the semiconductor integrated circuit structure in which the output D.C. potential is stabilized without using any capacitor element while gain control is allowed.

As described hereinabove, the output D.C. potential accompanied by the variation in a D.C. bias current is stabilized by this invention. As a result, it is possible to directly couple other amplifier circuits to this circuit and obtain a high gain amplifier circuit system having a stable amplifying action. Even if the operating current in the amplifying section is changed largely by AGC, the variation of the output D.C. potential is small. So the D.C. feedback can easily be given to all stages without fear of shifting the operating point. The D.C. operating point is made extremely stable, and hence the action of the amplifier becomes good.

FIG. 6 is a block circuit diagram showing one embodiment of the above circuit. $Q_1$ is an amplifying transistor, the base terminal 10 of which serves as a signal input terminal. The emitter is connected to a power source terminal 30 through a negative voltage supplying line 12 and ground in the A.C. sense. The collector is in cascode connection with the transistor circuit 31, which corresponds to the gain controlling circuit consisting of the transistors $Q_2$ and $Q_3$ in FIG. 3. A signal applied to the input terminal 10 is amplified by the transistor $Q_1$ and appears at the terminal 17 after receiving gain control at the block 31. 32 is an amplifier and is connected to terminal 17. The amplifier 17 is, for example, an emitter follower circuit wherein the signal is amplified and appears at the output terminal 33. The D.C. feedback is performed by a feedback circuit consisting of the voltage dividing resistors 34 and 35 and another resistor element 37 which connects the branch point 36 of the above resistors 34 and 35 with the signal input terminal 10. This feedback circuit is further composed in such a manner that the branch point 36 is grounded by an A.C. bypass capacitor 38 to feed back only the D.C. signal component to the input terminal 10. If the output D.C. potential of the gain controlling circuit section 31 is not compensated as in the conventional circuit, at least a portion of the gain controlling action is lost by the D.C. signal feedback even though the A.C. signal component is grounded by the bypass capacitor 38 to feed back only the D.C. signal component. The stabilization of the operating point by the D.C. negative feedback is not compatible with the AGC action obtained by changing the D.C. operating point of the amplifier circuit. However, if the compensation of the D.C. potential is made in accordance with this invention the stabilization of the operating point by the D.C. feedback is effected without harming the gain controlling action.

Figure 7:
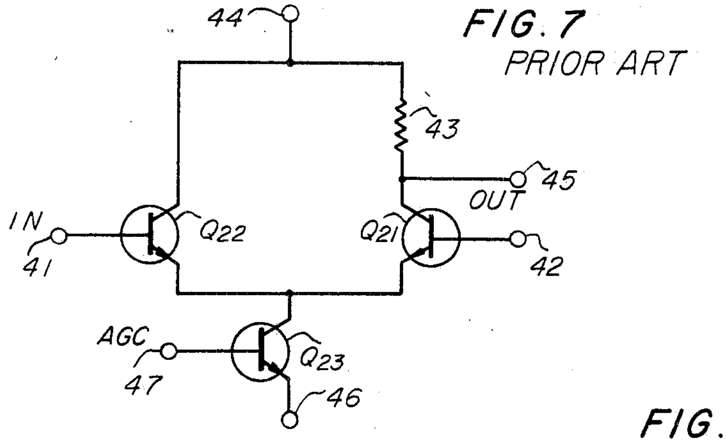
FIG. 7 shows a well-known prior art differential amplifier having a gain control function.

Next, another modified application of this invention to a differential amplifier will be explained. Prior to this, a well-konwn prior art differential amplifier will be explained first with reference to FIG. 7. The differential amplifier has two amplifying transistors whose bases serve as input terminals 41 and 42, and whose emitters are connected commonly to a negative voltage supplying terminal 46 through a gain controlling transistor $Q_{23}$. The collector of the transistor $Q_{21}$ is connected to a positive voltage supplying line 44 through a load resistor 43. The output signal is derived from the output terminal 45 connected to the collector. The collector of the other transistor $Q_{22}$ is directly connected to the positive voltage supplying terminal 44.

The signal amplification factor G of this circuit is given by $$G \propto \frac{R_{43}}{r_{21}+r_{22}} \quad (3)$$

where $r_{21}$ and $r_{22}$ are the emitter resistances of the amplifying transistors $Q_{21}$ and $Q_{22}$ respectively and $R_{43}$ is the value of the load resistor 43. When the base of the transistor $Q_{23}$ is connected to an AGC signal applying terminal 47 and the D.C. current flowing through the emitter circuit of the amplifying transistors $Q_{21}$ and $Q_{22}$ is varied in accordance with the AGC signal, the resistances $r_{21}$ and $r_{22}$ vary and control the gain G.

However, since in the above circuit the D.C. current flowing through the output transistor $Q_{21}$ necessarily varies with the gain control, the D.C. voltage drop appearing across the load resistor 43 is a varied and hence the output D.C. level vary during the gain controlling action. Such a variation in the output D.C. level always appears concomitantly with a gain controlling transistor $Q_{23}$ and not only in that case but also in the case when the emitter driving current of the differential amplifier is varied by a certain cause.

When the D.C. bias current of this differential amplifier is varied by the action of the gain controlling transistor $Q_{23}$, the D.C. currents flowing through the parallel circuit of the two transistors $Q_{21}$ and $Q_{22}$ vary in the same direction. In one embodiment of this invention, however, the following circuit composition is adopted to the circuit having such D.C. current variations.

Figures 8, 9:
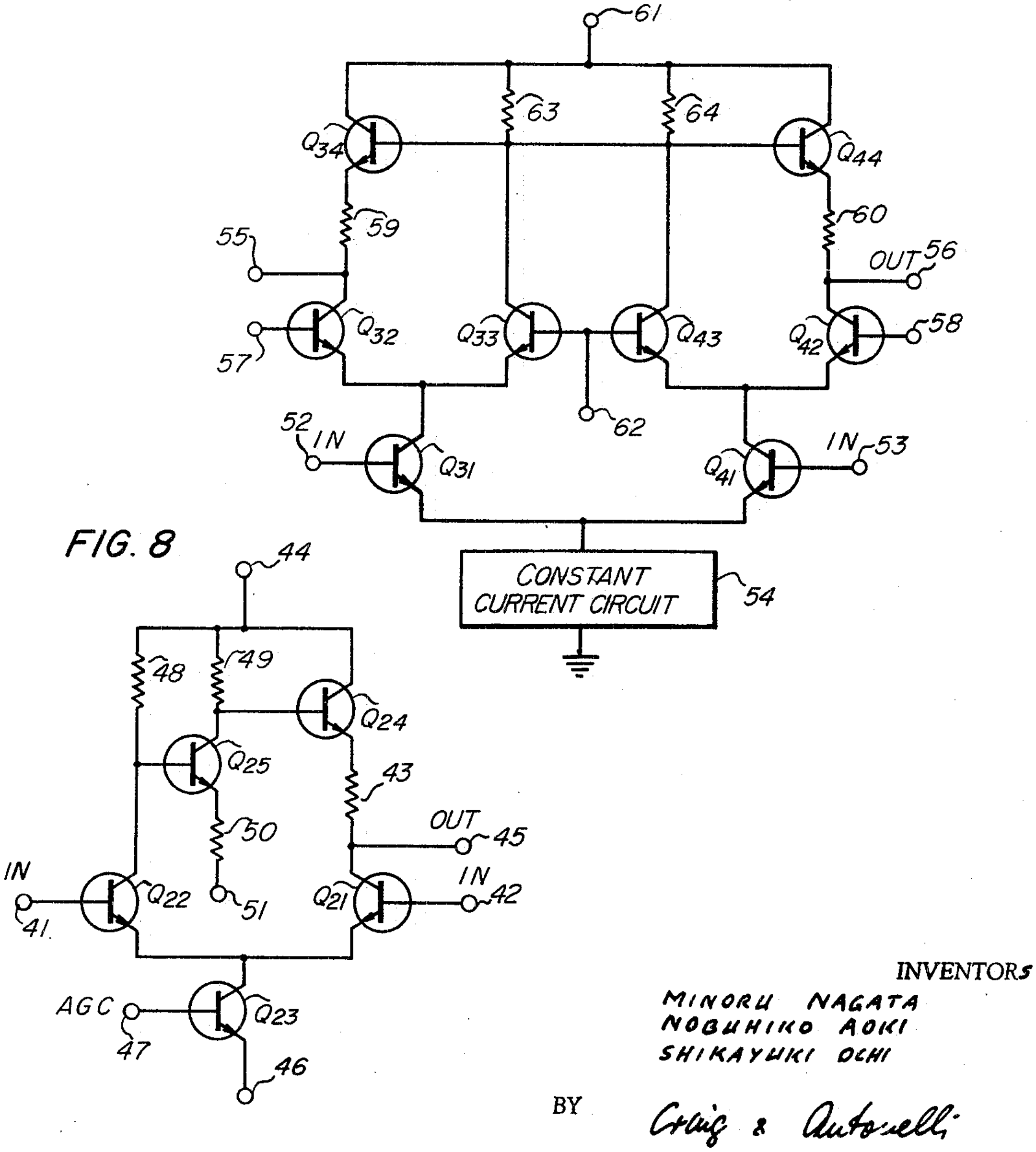
FIG. 8 is an example of a transistor circuit in differential amplifier circuit configuration according to this invention, which has a stabilized output D.C. level.
FIG. 9 is a circuit diagram according to another modification of this invention.

In FIG. 8, 48 is a resistor element inserted in series with the collector circuit of the transistor $Q_{22}$ in order to detect the D.C. variation appearing in the differential amplifying transistor $Q_{22}$. The resistor element 48 has a value substantially equal to that of the resistor element 43. $Q_{25}$ is a transistor provided to invert the phase of variation in the D.C. voltage drop appearing across the resistor element 48, the base thereof being connected to the collector of the transistor $Q_{22}$. The collector of the transistor $Q_{25}$ is connected to the positive voltage supplying terminal 44 through a resistor element 49 while the emitter is connected to a fixed potential point through a resistor element 50. If the values of the resistor elements 49 and 50 are substantially equal to each other, the transistor $Q_{25}$ acts as a phase inverter circuit having a gain of unity so that the variation in the D.C. voltage drop appearing across the resistor element 48 appears with its phase inverted across the resistor element 49. The transistor $Q_{24}$ is a load transistor inserted in series in the collector circuit of the transistor $Q_{21}$ to compensate the output D.C. potential, the base being connected to the collector of the phase inverting transistor $Q_{25}$. The D.C. potential variation appearing across the resistor element 49 is transmitted to the output circuit to regulate its D.C. potential. When the emitter current of the present differential amplifier varies, the D.C. currents in the amplifying transistors $Q_{21}$ and $Q_{22}$ vary in the same direction. However, since as described above the D.C. current variation appearing in the transistor $Q_{22}$ is converted to have the reverse direction by the phase inverter circuit of transistor $Q_{25}$ and thereafter transmitted to the collector circuit of the output transistor $Q_{21}$ by way of the transistor $Q_{24}$ for compensating the output D.C. potential, the variation in the D.C. potential appearing across the load resistor 43 of the output circuit is completely absorbed and thus the output D.C. potential is kept constant. Specifically in the circuit of this embodiment, if the emitter-base voltages $V_{BE}$ of the transistors $Q_{24}$ and $Q_{25}$ are equal, the D.C. potential of the output terminal 46 becomes equal to that of the terminal 51. Since the value of this D.C. potential is determined independently of the emitter driving current and the operating power source voltage of the differential amplifier, the output D.C. potential can be selected arbitrarily by fixing the D.C. potential of the terminal 51.

The transistors $Q_{24}$ and $Q_{25}$ are easily made to have the same characteristics by integrating them on a same semiconductor substrate. Therefore, the circuit according to this invention has a unique effect as a direct-coupled transistor circuit, in which the design of the following circuits is easily done. Although the above differential amplifier circuit is of the unbalanced type, it has the advantage of having an amplifying gain twice as large as that of a conventional unbalanced type differential amplifier circuit. The reason is that the signal after being amplified by the amplifying transistor $Q_{22}$ is inverted its phase in the transistor $Q_{25}$ and transmitted through the transistor $Q_{24}$ to the output circuit to be added therein with the signal amplified by the other amplifying transistor $Q_{21}$.

FIG. 9 is a circuit diagram in one embodiment of this invention where this invention is applied to another differential amplifier circuit. In this figure, $Q_{31}$ and $Q_{41}$ are differential amplifying transistors whose bases 52 and 53 are signal input terminals. They are disposed in parallel with each other and the emitter circuits are driven by a constant current circuit 54 commonly. Signals applied at the input terminals 52 and 53 are amplified by the transistors 31 and 41 and derived as output signals from the collector terminals 55 and 56 of the transistors $Q_{32}$ and $Q_{42}$ which are in cascode connection with the collector circuits of transistors $Q_{31}$ and $Q_{41}$. The base terminals 57 and 58 of the transistors $Q_{32}$ and $Q_{42}$ are maintained at an equal bias voltage, and are equivalent in the D.C. sense. The collectors of the transistors $Q_{32}$ and $Q_{42}$ are connected in series with load resistor elements 59 and 60, and transistors $Q_{34}$ and $Q_{44}$ respectively, which are connected to a positive voltage supplying terminal 61. The collectors of the differential amplifying transistors $Q_{31}$ and $Q_{41}$ are connected with bypass transistors $Q_{33}$ and $Q_{43}$ in parallel with the transistors $Q_{32}$ and $Q_{42}$ of cascode connection whereby the signal amounts divided into the output transistors $Q_{32}$ and $Q_{42}$ are controlled. The bases of the bypass transistors $Q_{33}$ and $Q_{43}$ are connected together to receive simultaneously the AGC signal which is applied to the terminal 62. The collectors of these transistors $Q_{33}$ and $Q_{43}$ are connected to the positive voltage supplying terminal 61 by way of resistor elements 63 and 64 respectively and also to the base terminals of transistors $Q_{34}$ and $Q_{44}$ respectively. The transistors $Q_{34}$ and $Q_{44}$ are load transistors for compensating the D.C. potential. They operate in a similar way as the transistor $Q_4$ shown in FIG. 3 to compensate the variation of output D.C. potential due to the gain controlling action. Since the present circuit is a differential amplifier circuit, the output signal currents flowing through the transistors $Q_{31}$ and $Q_{41}$ have opposite phases. Even if the A.C. signal currents amplified by the transistors $Q_{31}$ and $Q_{41}$ are divided to flow through the bypass transistors $Q_{33}$ and $Q_{43}$, they cancel each other across the resistor elements 63 and 64. So, the circuit transmits only the varying component of the D.C. current appearing across the resistor element 63 and 64 to the output circuit through the load transistors $Q_{34}$ and $Q_{44}$ for compensating the D.C. potential. Namely, the present circuit can be composed of only one kind of transistor and resistor element without requiring any A.C. bypass capacitor. Besides the general advantage of a differential amplifier circuit, the present circuit has an excellent frequency characteristic as it belongs to the gain controlling and cascode connection types. In spite of the gain control, the output D.C. potential is stable. Multi-stage connection with the D.C. feedback as described before is of course possible. Therefore, the present circuit is very useful for a direct-coupled transistor circuit of the integrated circuit configuration.

Although in the above embodiments explanation has been given mainly of circuits having an AGC function, it is evident that the inventive concept of this invention is not limited to such embodiment alone but may be applied with a unique effect in each case to various circutis having a variation in output D.C. potential due to a D.C. potential variation.

What is claimed is:

1. A transistor circuit having a stabilized output D.C. level comprising:

(a) a transistor amplifying circuit having an amplifying transistor the base of which is provided with an input terminal and the collector of which is provided with an output terminal, signal input means for supplying an input signal to the input terminal of the amplifying transistor, and bias means for supplying an operating bias voltage to the input terminal of said amplifying transistor;

(b) a load transistor having an emitter, a base and a collector;

(c) a load resistor connected between the collector of the amplifying transistor and the emitter of the load transistor;

(d) a D.C. source for supplying an operating bias current through the series circuit of the load transistor and the load resistor to the amplifying circuit;

(e) means for generating a control signal representative of the strength of the amplified input signal component in the output signal;

(f) gain control means for varying the base bias voltage of the amplifying transistor in inverse proportion to the control signal; and (g) means for varying the base bias potential of said load transistor in inverse proportion to the control signal so that the emitter potential of the load transistor varies to compensate the variation in the potential drop across the load resistor caused by the variation in the operating bias current flowing therethrough, thereby stabilizing the output D.C. level at the output terminal.

2. A transistor circuit having a stabilized output D.C. level comprising:

(a) a transistor amplifying circuit having a first and a second amplifying transistor, the collector of the first amplifying transistor being connected to the emitter of the second amplifying transistor in cascode configuration, the base of the first amplifying transistor being provided with an input terminal, the collector of the second amplifying transistor being provided with an output terminal, and signal input means for supplying an input signal to the input terminal;

(b) a load transistor having an emitter, a base and a collector;

(c) a load resistor connected between the collector of the second amplifying transistor and the emitter of the load transistor;

(d) a D.C. source for supplying an operating bias current through the series circuit of the load transistor and the load resistor to the transistor amplifier circuit so that the output D.C. level at the output terminal of the amplifying circuit may be defined by the emitter potential of the load transistor and the potential drop across the load resistor caused by the flow of the operating bias current therethrough;

(e) a first bypass transistor the emitter of which is connected to the emitter of said second amplifying transistor;

(f) a second load resistor connected between the collector of said first bypass transistor and the collector of said load transistor;

(g) gain control means for controlling the base bias potential of the bypass transistor in proportion to the strength of an amplified input signal component in an output signal derived from the output terminal of the amplifying circuit;

(h) A.C. bypass means for grounding the collector of said bypass transistor in A.C. sense; and (i) means for varying the base bias potential of said load transistor in proportion to the collector potential of the bypass transistor so that the emitter potential of the load transistor varies to compensate the variation in the potential drop across the load resistor caused by the variation in the operating bias current flowing therethrough, whereby stabilizing the output D.C. level at the output terminal.

3. A transistor circuit according to claim 2, in which said first and second load resistors are of substantially equal resistance values.

4. A transistor circuit according to claim 2, in which said transistor amplifying circuit further comprises a second bypass transistor having substantially the same characteristics to those of said first load transistor and the base and the collector of which are connected in common to each other, said second bypass transistor being connected in series to said second load resistor, and said series circuit of the second bypass transistor and said second load resistor being inserted between the collector of said first bypass transistor and the collector of said load transistor.

5. A transistor circuit having a stabilized output D.C. level comprising:

(a) a transistor amplifying circuit having a first and a second amplifying transistor, the collector of the first transistor being connected to the emitter of the second transistor in cascode configuration, the base of the first transistor being provided with an input terminal, and the collector of the second transistor being provided with an output terminal;

(b) a first load transistor having an emitter, a base and a collector;

(c) a load resistor connected between the collector of the second transistor and the emitter of the load transistor;

(d) a D.C. source for supplying an operating current through the series circuit of the load transistor and the load resistor to the transistor amplifying circuit so that the output D.C. level at the output terminal of the second amplifying transistor may be defined by the emitter potential of the load transistor and the potential drop across the load resistor caused by the flow of the operating bias current therethrough;

(e) a first bypass transistor, the emitter of which is connected to the emitter of the second amplifying transistor, and the collector of which is connected to the D.C. source;

(f) a control means for controlling the base bias potential of the bypass transistor in proportion to the strength of the amplified input signal component in the output signal derived from the output terminal;

(g) an image circuit having an image transistor, the base of which is connected to the base of the first bypass transistor so that its collector D.C. current may vary equivalently with that of said first bypass transistor, and a second load resistor connected between the collector of the image transistor and the D.C. source; and, (h) means for connecting the collector of the image transistor to the base of the first load transistor so that the base bias potential of the first load transistor may be varied in proportion to the variation in the collector D.C. current flowing through the image transistor, whereby stabilizing the output D.C. level at the output terminal.

6. A transistor circuit according to claim 5, in which said image circuit further comprises a second image transistor having an emitter connected in common to the emitter of the first image transistor, a base connected to the base of the second amplifying transistor and a collector connected to the D.C. source.

7. A transistor circuit according to claim 6, in which said image circuit further comprises a second load transistor having substantially the same characteristics to those of the first load transistor, the base and the collector of which are connected in common to the D.C. source and the emitter of which is connected in series to the second load resistor.

8. A transistor circuit having a stabilized output D.C. level comprising:

(a) a first and second amplifying transistor having their emitters commonly connected to each other to form a differential amplifier configuration, in which input signal applied between input terminals connected with the bases of the first and second transistors is differentially amplified and transmitted out from an output terminal connected with the collector of the first transistor;

(b) a first and second load resistors connected with the collectors of the first and second transistors respectively;

(c) a load transistor having an emitter, a base and a collector, the emitter of which is connected with the first load resistors;

(d) a D.C. source for supplying an operating bias current to the first transistor through the series circuit of the load transistor and the first resistor and to the second transistor through the second resistor respectively, thereby the output D.C. level at the output terminal being defined by the emitter potential of the load transistor and the potential drop across the first load resistor caused by the flow of operating bias current therethrough;

(e) control means for inversely varying the base bias potential of the load transistor so that the emitter potential of the load transistor may compensate the variation in the potential drop across the first load resistor in proportion to the D.C. potential drop across the second load resistor, whereby stabilizing the output D.C. level at the output terminal.

9. A transistor circuit according to claim 8, which further comprises:

(a) a third transistor the collector of which is connected in common to the emitters of said first and second transistors and the emitter of which is connected to said D.C. source for controlling the operating current of said first and second transistors; and (b) means for inversely controlling the base bias potential of the third transistor in proportion to the strength of the amplified input signal component in the output signal.

10. A transistor circuit according to claim 8, in which said control means comprises:

(a) an inversion transistor having an emitter, a base connected to the collector of the second transistor, and a collector connected to the base of the load transistor; and (b) a first and a second bias resistor having substantially equal resistance values; said first bias resistor connecting said collector of said inversion transistor to said D.C. source and said second bias resistor connecting a fixed potential point.

References Cited

UNITED STATES PATENTS 3,365,673 1/1968 Barditch et al. ------ 330—29 X

ROY LAKE, Primary Examiner

J. B. MULLINS, Assistant Examiner

U.S. Cl. X.R.

330—19, 20, 30